(12) United States Patent
Kim

(10) Patent No.: US 10,090,029 B2
(45) Date of Patent: Oct. 2, 2018

(54) ELECTRONIC DEVICE FOR SUPPRESSING READ DISTURBANCE AND METHOD OF DRIVING THE SAME

(71) Applicant: SK hynix Inc., Icheon (KR)

(72) Inventor: Myoung-Sub Kim, Seongnam (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/638,201

(22) Filed: Jun. 29, 2017

(65) Prior Publication Data

US 2018/0005673 A1     Jan. 4, 2018

Related U.S. Application Data

(60) Provisional application No. 62/357,093, filed on Jun. 30, 2016.

(51) Int. Cl.
| | |
|---|---|
| *G11C 8/00* | (2006.01) |
| *G11C 7/12* | (2006.01) |
| *G11C 11/16* | (2006.01) |
| *G11C 13/04* | (2006.01) |
| *G11C 13/00* | (2006.01) |

(52) U.S. Cl.
CPC ............ *G11C 7/12* (2013.01); *G11C 11/1673* (2013.01); *G11C 13/0002* (2013.01); *G11C 13/004* (2013.01); *G11C 13/0004* (2013.01); *G11C 13/04* (2013.01); *G11C 2013/0052* (2013.01); *G11C 2213/31* (2013.01); *G11C 2213/32* (2013.01)

(58) Field of Classification Search
CPC ....... G11C 7/12; G11C 11/1673; G11C 13/04; G11C 2213/31; G11C 2213/32
USPC ........................................................ 365/163
See application file for complete search history.

(56) References Cited

U.S. PATENT DOCUMENTS

| | | | | |
|---|---|---|---|---|
| 6,487,113 | B1 * | 11/2002 | Park ................... | G11C 13/0004 365/148 |
| 7,295,464 | B2 * | 11/2007 | Cho ..................... | G11C 11/5678 365/113 |
| 2014/0177355 | A1 * | 6/2014 | Kim .................... | G11C 13/0004 365/189.15 |
| 2015/0187417 | A1 | 7/2015 | Castro | |

* cited by examiner

*Primary Examiner* — Tha-o H Bui

(57) ABSTRACT

An electronic device includes a semiconductor memory that includes: a memory cell coupled between first and second lines and having a specific resistance state; a first read circuit suitable for supplying a predetermined pattern of a read voltage to the first line to generate a cell current corresponding to the specific resistance state of the memory cell during a read operation mode; and a second read circuit suitable for generating read data based on the cell current flowing through the second line during the read operation mode.

20 Claims, 8 Drawing Sheets

ELECTRONIC DEVICE FOR SUPPRESSING READ DISTURBANCE AND METHOD OF DRIVING THE SAME

CROSS-REFERENCE TO RELATED APPLICATION

The present application claims priority of U.S. Provisional Patent Application No. 62/357,093, entitled "ELECTRONIC DEVICE AND METHOD OF DRIVING THE SAME" and filed on Jun. 30, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which is capable of suppressing read disturbance.

In one aspect, there is provided an electronic device including a semiconductor memory. The semiconductor memory may include: a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode.

Implementations of the above electronic device may include one or more the following.

The specific resistance state may include a low resistance state.

The first read circuit may generate the slow quenching pattern of the read voltage, the slow quenching pattern having a slope sufficiently low to maintain the specific resistance state of the memory cell during the read operation mode. The first read circuit may include: a first read controller suitable for generating the slow quenching pattern of a read supply voltage during the read operation mode; a second read controller suitable for generating a driver control signal, the driver control signal having a substantially constant voltage level during the read operation mode; and a driver suitable for driving a node coupled to the first line to a voltage level substantially equal to the read supply voltage in response to the driver control signal. The first read circuit may include: a first read controller suitable for generating a read supply voltage having a substantially constant voltage level during the read operation mode; a second read controller suitable for generating the slow quenching pattern of a driver control signal during the read operation mode; and a driver suitable for driving a node coupled to the first line in response to the read supply voltage and the driver control signal. The first read circuit may include: a first read controller suitable for generating a read supply voltage having a substantially constant voltage level during the read operation mode; a second read controller suitable for generating a plurality of driver control signals, which are sequentially deactivated, during the read operation mode; and a plurality of drivers suitable for driving a node coupled to the first line in response to the plurality of read control signals, respectively, and the read supply voltage. The memory cell may include a variable resistance element and a selecting element which are coupled in series, wherein the variable resistance element switches between resistance states according to a voltage or a current applied two ends of the variable resistance element, the cell current flowing through the variable resistance element according to the specific resistance state, and wherein the selecting element is turned on or off according to a voltage difference across the memory cell and a resistance value of the variable resistance element. The first read circuit may supply a predetermined first voltage to the first line during at least an initial period of the read operation mode, and wherein the second read circuit supplies a predetermined second voltage to the second line during the read operation mode, the first voltage being higher than the second voltage. The second read circuit may generate the read data by comparing a magnitude of a reference current and a magnitude of the cell current.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory may be part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory may be part of the cache memory unit in the processor.

The electronic device may further include a processing system which includes: a processor configured to decode a command received by the processor and control an operation for information based on a result of decoding the command;

an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory may be part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory may be part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory may be part of the memory or the buffer memory in the memory system.

In another aspect, a method of driving an electronic device including a semiconductor memory, the method may include: supplying a predetermined voltage level of a read voltage to a first line coupled to a first end of a selected memory cell during an initial period of a read operation mode; supplying a slow quenching pattern of the read voltage to the first line during a subsequent period of the read operation mode, the subsequent period following the initial period; and generating read data based on a cell current flowing through a second line coupled to a second end of the selected memory cell during the subsequent period of the read operation mode.

Implementations of the above method may include one or more of the following.

The predetermined pattern of the read voltage may include the slow quenching pattern, the slow quenching pattern having a slope sufficiently low to maintain a resistance state of the selected memory cell during the read operation mode. The supplying of the predetermined pattern of the read voltage may include: supplying the slow quenching pattern of a read supply voltage; generating a driver control signal having a substantially constant voltage level; and driving a node coupled to the first line to have a voltage level substantially equal to the read supply voltage in response to the driver control signal. The supplying of the predetermined pattern of the read voltage may include: generating a read supply voltage having a substantially constant voltage level; generating the slow quenching pattern of a driver control signal; and driving a node coupled to the first line in response to the read supply voltage and the driver control signal. The supplying of the predetermined pattern of read voltage may include: generating a read supply voltage having a substantially constant voltage level; generating a plurality of driver control signals which are sequentially deactivated; and driving a node coupled to the first line in response to the read supply voltage and the plurality of driver control signals. The generating of the read data may include: comparing a magnitude of the cell current and a magnitude of a reference current; and generating the read data based on the comparison result.

DETAILED DESCRIPTION

Various examples and implementations of the disclosed technology are described below in detail with reference to the accompanying drawings.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single-layer or multi-layer structure, which exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO), or a cobalt oxide (CoO), or a perovskite material such as a strontium titanium oxide (STO:SrTiO) or a praseodymium calcium manganese oxide (PCMO:PrCaMnO).

Moreover, the variable resistance element may include a phase change material. The phase change material may include a chalcogenide material such as germanium-antimony-tellurium (GST:GeSbTe). The variable resistance element switches between different resistance states by changing its structure into a crystalline state or an amorphous state using a heat.

The variable resistance element may include two magnetic layers and a tunnel barrier layer interposed between the two magnetic layers. The magnetic layer may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to magnetization directions of the two magnetic layers. For example, the variable resistance element may be in a low resistance state when the magnetization directions of the two magnetic layers are parallel, and be in a high resistance state when the magnetization directions of the two magnetic layers are anti-parallel.

Figure 1:
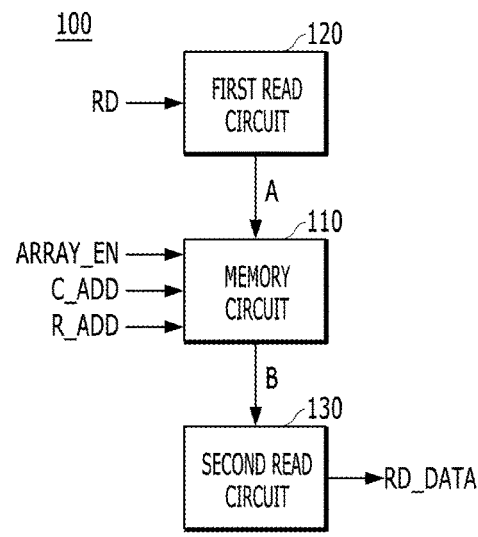
FIG. 1 is a configuration diagram of a memory device in accordance with an implementation.

FIG. 1 is a block configuration diagram of a memory device 100 in accordance with an implementation.

Referring to FIG. 1, the memory device 100 may include a memory circuit 110, a first read circuit 120, and a second read circuit 130.

The memory circuit 110 may be coupled between first and second nodes A and B. The memory circuit 110 may perform a write operation or a read operation in response to a cell array enable signal ARRAY_EN, a column address signal C_ADD, and a row address signal R_ADD. For example, the memory circuit 110 may change a resistance state of a selected memory cell based on a fast quenching pattern or a slow quenching pattern of a write current provided through the first node A, during a write operation mode. The memory circuit 110 may output a cell current, which has a magnitude that varies with the resistance state of the selected memory cell, to the second node B in response to a read voltage provided through the first node A, during a read operation mode.

The first read circuit 120 may supply a predetermined pattern of the read voltage to the first node A to generate a cell current corresponding to a specific resistance state during the read operation mode. For example, the first read circuit 120 may generate a slow quenching pattern of the read voltage in response to a read command signal RD, such that a slow quenching pattern of the cell current is generated. The slow quenching pattern of the cell current and the slow quenching pattern of the read voltage may have similar waveform shapes to each other. The slow quenching pattern of the cell current and the slow quenching pattern of the write current may have similar waveform shapes to each other. Depending on design conditions, the magnitudes or generation times of the currents (i.e., the cell current and the write current) may be equal to each other or different from each other.

The second read circuit 130 may generate read data RD_DATA based on the cell current output through the second node B during the read operation mode. For example, the second read circuit 130 may compare the cell current and a reference current, and generate the read data RD_DATA according to the comparison result.

Figure 2:
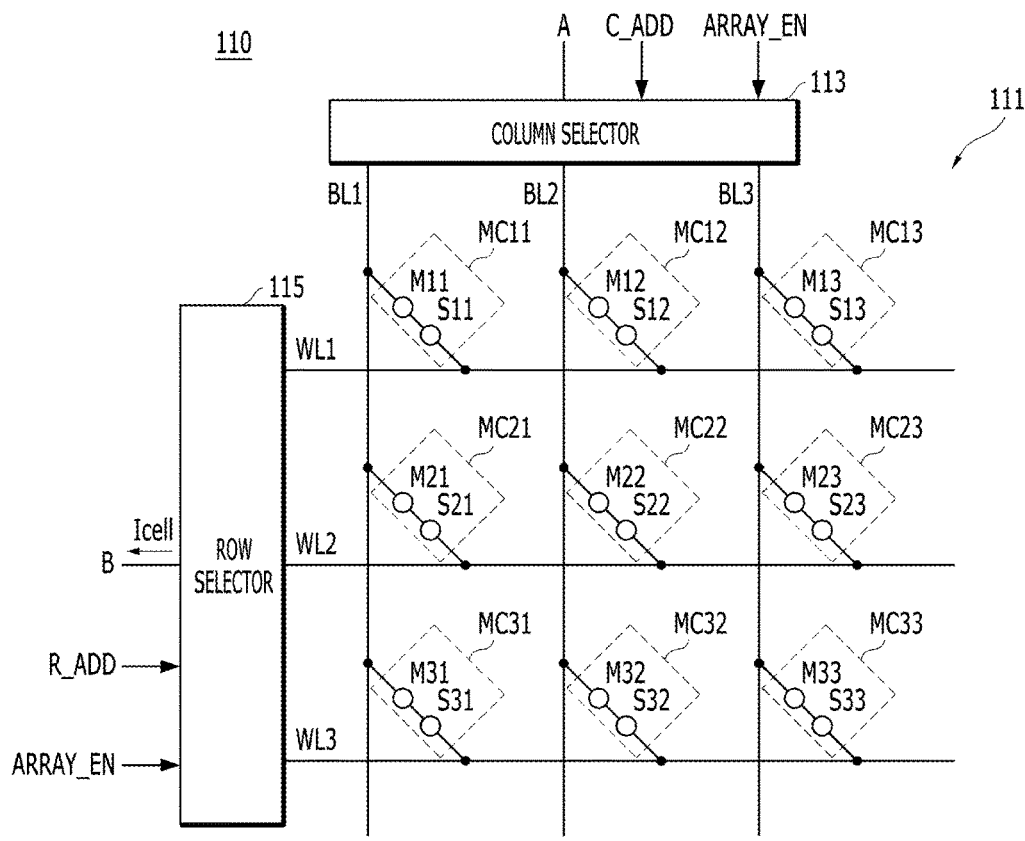
FIG. 2 is a configuration diagram of a memory circuit illustrated in FIG. 1 in accordance with an implementation.

FIG. 2 is a configuration diagram of an example of the memory circuit 110 illustrated in FIG. 1.

Referring to FIG. 2, the memory circuit 110 may include a memory cell array 111, a column selector 113, and a row selector 115.

The memory cell array 111 may have a cross-point array structure. The cross-point array structure may include a plurality of memory cells MC11 to MC33 arranged at respective intersections between a plurality of bit lines BL1 to BL3 and a plurality of word lines WL1 to WL3. FIG. 2 illustrates the three bit lines BL1 to BL3, the three word lines WL1 to WL3, and the nine memory cells MC11 to MC33. However, implementations of this patent document are not limited thereto.

Each of the plurality of memory cells MC11 to MC33 may have the same configuration. Hereafter, the first memory cell MC11 coupled between the first bit line BL1 and the first word line WL1 will be representatively described for the interest of brevity.

The first memory cell MC1 may include a first variable resistance element M11 and a first selecting element S11, which are coupled in series between the first bit line BL1 and the first word line WL1. For example, the first variable resistance element M11 may include a phase change material. In this case, the first variable resistance element M11 may have a high resistance state corresponding to an amorphous state or a low resistance state corresponding to a crystalline state. More specifically, the first variable resistance element M11 may have the high resistance state corresponding to the amorphous state when the first variable resistance element M11 is heated and thus melts by a fast quenching pattern of a write current and then is rapidly cooled, or may have the low resistance state corresponding to the crystalline state when the first variable resistance element M11 is heated and thus melts by a slow quenching pattern of the write current and then is slowly cooled.

The first selecting element S11 may include a diode or an Ovonic Threshold Switch (OTS) element. In this case, the first selecting element S11 is turned on or off according to a voltage difference across the first memory cell MC11 or a voltage difference between the first bit line BL1 and the word line WL1.

The column selector 113 may electrically couple any one of the plurality of bit lines BL1 to BL3 to the first node A in response to the column address signal C_ADD.

The row selector 115 may electrically couple any one of the plurality of word lines WL1 to WL3 to the second node B in response to the row address signal R_ADD.

The column selector 113 and the row selector 115 may be activated in response to the cell array enable signal ARRAY_EN, thereby performing the above coupling operations.

Figure 3A:
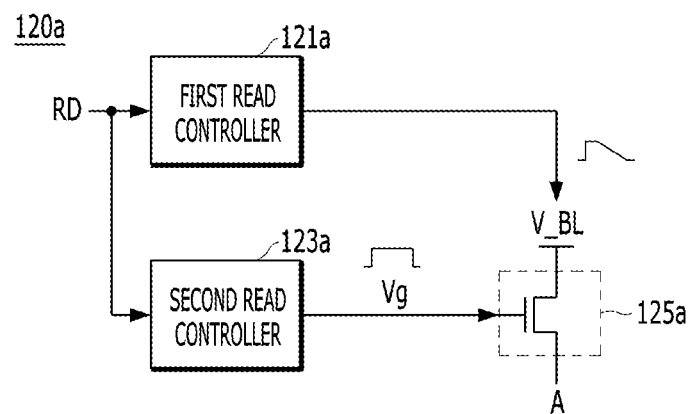
FIGS. 3A, 3B, and 3C are configuration diagrams illustrating examples of a first read circuit of FIG. 1.
Figure 3B:
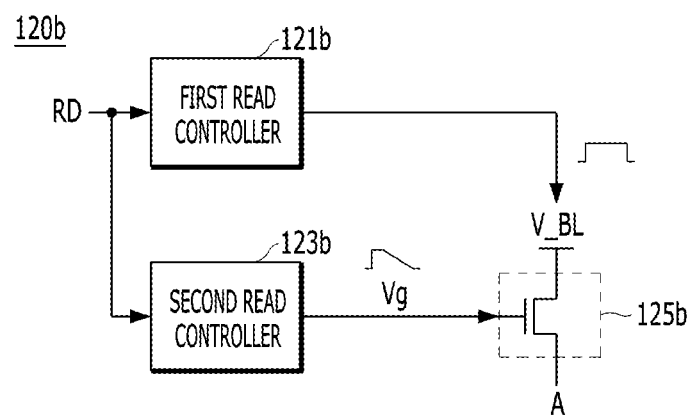
Figure 3C:
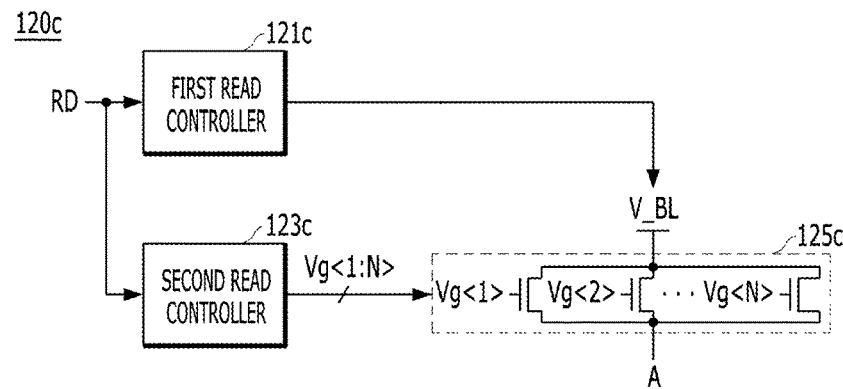

FIGS. 3A, 3B, and 3C are configuration diagrams illustrating first read circuits 120a, 120b, and 120c, respectively, suitable for use as the first read circuit 120 of FIG. 1 in accordance with implementations.

Referring to FIG. 3A, the first read circuit 120a may include a first read controller 121a, a second read controller 123a, and a driver 125a.

The first read controller 121a may generate a slow quenching pattern of a read supply voltage V_BL in response to the read control signal RD.

The second read controller 123a may generate a driver control signal Vg having a substantially constant voltage level in response to the read control signal RD.

The driver 125a may drive the read voltage at the first node A in response to the read supply voltage V_BL and the driver control signal Vg. For example, the driver 125a adjusts a level of the read voltage at the first node A substantially equal to a voltage level of the read supply voltage V_BL in response to the driver control signal Vg, which has the substantially constant voltage level. In an implementation, the driver 125a includes an n-channel metal-oxide-semiconductor (NMOS) transistor. As a result, the read voltage may be generated through the first node A, and may have the slow quenching pattern corresponding to the slow quenching pattern of the read supply voltage V_BL.

Referring to FIG. 3B, the first read circuit 120b may include a first read controller 121b, a second read controller 123b, and a driver 125b.

The first read controller 121b may generate a read supply voltage V_BL having a substantially constant level in response to the read control signal RD.

The second read controller 123b may generate a slow quenching pattern of a driver control signal Vg in response to the read control signal RD.

The driver 125b may drive the read voltage at the first node A in response to the read supply voltage V_BL and the driver control signal Vg. For example, the read voltage at the first node A may have a pattern similar to the slow quenching pattern of the driver control signal Vg when the read supply voltage V_BL has the substantially constant level. As a result, the read voltage may be generated through the first node A, and may have the slow quenching pattern corresponding to the slow quenching pattern of the driver control signal Vg.

Referring to FIG. 3C, the first read circuit 120c may include a first read controller 121c, a second read controller 123c, and a plurality of drivers 125c.

The first read controller 121c may generate a read supply voltage V_BL having a substantially constant voltage level in response to the read control signal RD.

The second read controller 123c may generate a plurality of driver control signals Vg<1:N>, which are sequentially deactivated in response to the read control signal RD.

The plurality of drivers 125c may drive the read voltage at the first node A in response to the read supply voltage V_BL and the plurality of driver control signals Vg<1:N>. The read voltage may be generated through the first node A, and may have a slow quenching pattern corresponding to the sequential deactivation of the plurality of driver control signals Vg<1:N>. The plurality of drivers 125c, which are sequentially turned off in response to the plurality of driver control signals Vg<1:N>, decrease a level of the read voltage.

Figure 4:
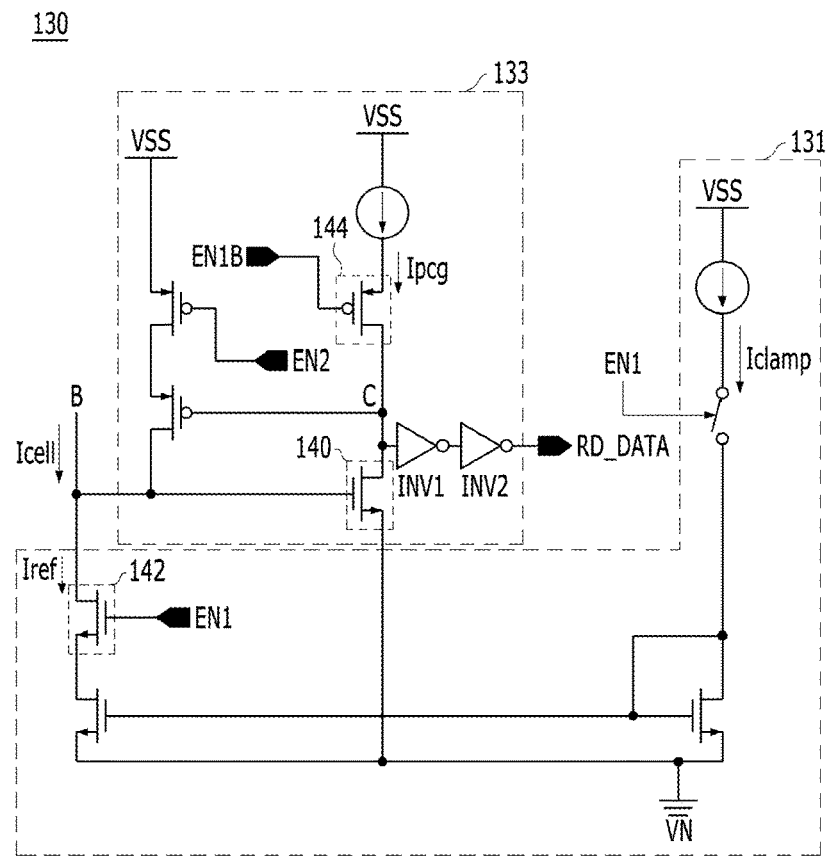
FIG. 4 is a configuration diagram of a second read circuit illustrated in FIG. 1 in accordance with an implementation.

FIG. 4 is a configuration diagram of an example of the second read circuit 130 illustrated in FIG. 1.

Referring to FIG. 4, a second read circuit 130 may include a current sinker 131 and a detector 133.

The current sinker 131 may sink a reference current Iref corresponding to a clamping current Iclamp from the second node B, in response to a first read enable signal EN1. For example, when the first read enable signal EN1 is activated, the current sinker 131 may generate the reference current Iref by mirroring the clamping current Iclamp. The magnitude of the reference current Iref may be determined to be larger than a first magnitude of a cell current Icell when a selected memory cell is in the high resistance state, and to be smaller than a second magnitude of the cell current Icell when the selected memory cell is in the low resistance state.

The detector 133 may generate read data RD_DATA indicating a voltage level at the second node B, based on an inverted first read enable signal EN1B and a second read enable signal EN2. The inverted first read enable signal EN1B may be an inverted version of the first read enable signal EN1. The voltage level at the second node B may vary according to the magnitude of the cell current Icell and the magnitude of the reference current Iref. For example, when the selected memory cell is in the high resistance state and thus the magnitude of the reference current Iref is larger than that of the cell current Icell, the voltage at the second node B may become substantially equal to a negative voltage VN having a negative potential. In this case, the detector 133 may generate the read data RD_DATA indicating a logic high value corresponding to a precharge current Ipcg. The ground voltage VSS may be greater than the negative voltage VN.

More specifically, when the magnitude of the reference current Iref is larger than the magnitude of the cell current Icell and an NMOS transistor 142 is turned on in response to the first read enable signal EN1 having a logic high value, the voltage at the second node B decreases and becomes sufficiently low to turn off an NMOS transistor 140 having a control terminal connected to the second node B. At this time, the inverted first read enable signal EN1B has a logic low value, and thus a PMOS transistor 144 receiving the inverted first read enable signal EN1B is turned on. As a result, a voltage at a node C has a level that is determined by the magnitude of the precharge current Ipcg, such that the read data RD_DATA has a voltage level, which indicates the logic high value.

On the other hand, when the selected memory cell is in the low resistance state and thus the magnitude of the cell current Icell is larger than that of the reference current Iref, the voltage at the second node B may become substantially equal to the read voltage at the first node A. In this case, the detector 133 may generate the read data RD_DATA indicating a logic low value, regardless of a magnitude of the precharge current Ipcg. More specifically, when the magnitude of the reference current Iref is smaller than the cell current Icell, the voltage at the second node B becomes sufficiently high to turn on the NMOS transistor 140 having the control terminal connected to the second node B even if the first read enable signal EN1 has the logic high value and thus the transistor 142 is turned on. At this time, because the inverted first read enable signal EN1B has the logic low value and the first read enable signal EN1 has the logic high value, the PMOS transistor 144 receiving the inverted first read enable signal EN1B is turned on, and the NMOS transistor 142 receiving the first read enable signal EN1 is turned on. However, since the NMOS transistor 140, which is turned on, makes the voltage at the node C sufficiently low, and thus the read data RD_DATA has a low logic value that is determined substantially independently of the magnitude of the precharge current Ipcg.

The detector 133 may prevent an overcurrent from flowing to the selected memory cell, based on the second read enable signal EN2. The detailed descriptions of this function are omitted herein for the interest of brevity.

Hereafter, a read operation of a memory device (e.g., the memory device 100 of FIG. 1) having the above-described configurations will be described with reference to FIGS. 5A to 5C.

Figure 5A:
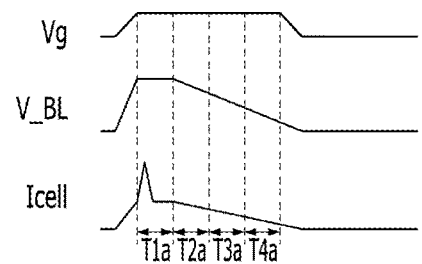
FIGS. 5A, 5B, and 5C are timing diagrams for illustrating examples of an operation of the memory device illustrated in FIG. 1.
Figure 5B:
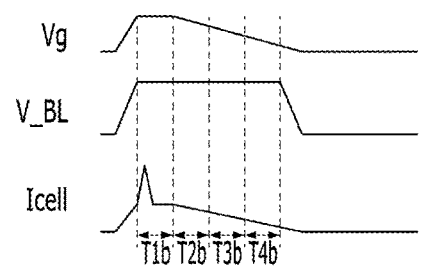
Figure 5C:
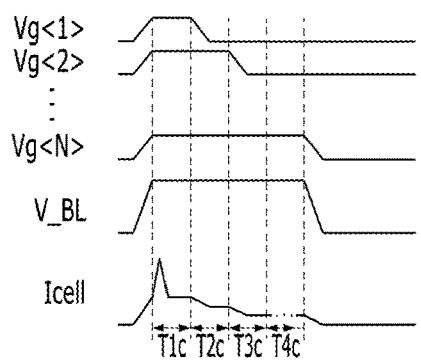

FIG. 5A is a timing diagram illustrating an operation of the first read circuit 120a of FIG. 3A, FIG. 5B is a timing diagram illustrating an operation of the first read circuit 120b of FIG. 3B, and FIG. 5C is a timing diagram illustrating an operation of the first read circuit 120c of FIG. 3C.

Before describing the operations of the first read circuits 120a, 120b, and 120c with reference to FIGS. 5A, 5B, and 5C, respectively, operations of the memory circuit 110 of FIG. 2 and the operation of the second read circuit 130 of FIG. 4 will be described as follows.

First, referring to FIG. 2, a process of selecting any one of the plurality of memory cells MC11 to MC33 included in the memory circuit 110 will be described.

The column selector 113 may couple any one of the plurality of bit lines BL1 to BL3 to the first node A in response to the cell array enable signal ARRAY_EN and the column address signal C_ADD, and the row selector 115 may couple any one of the plurality of word lines WL1 to WL3 to the second node B in response to the cell array enable signal ARRAY_EN and the row address signal R_ADD. Assuming that the coupled bit line to the first node A among the plurality of bit lines BL1 to BL3 is a selected bit line and the coupled word line to the second node B among the plurality of word lines WL1 to WL3 is a selected word line, a memory cell coupled between the selected word line and the selected bit line may correspond to the selected memory cell. For example, assuming that the selected bit line is the first bit line BL1 and the selected word line is the first word line WL1, the first memory cell MC11 coupled between the first bit line BL1 and the first word line WL1 may correspond to the selected memory cell. Both ends of the selected memory cell MC11 may be electrically coupled to the first and second nodes A and B respectively by the column selector 113 and the row selector 115.

Next, referring to FIG. 4, a reset process of the second read circuit 130 will be described.

When the first read enable signal EN1 is enabled to have a logic high value, the current sinker 131 may be activated. The current sinker 131 may sink the reference current Iref from the second node B to the negative voltage VN. For example, the current sinker 131 may generate the reference current Iref by mirroring the clamping current Iclamp. The magnitude of the reference current Iref may be determined to be larger than the magnitude of the cell current Icell when the selected memory cell is in the high resistance state. At this time, the voltage at the second node B may be reset to become substantially equal to the negative voltage VN. The detector 133 may be activated in response to the inverted first read enable signal EN1B that has a logic low value and supply the precharge current Ipcg to the node C. As a result, the NMOS transistor 140 may be turned off and the detector 133 may reset the read data RD_DATA to a level corresponding to the ground voltage VSS based on the precharge current Ipcg.

More specifically, when the magnitude of the reference current Iref is larger than the magnitude of the cell current Icell, the voltage at the node B becomes sufficiently low to turn off the NMOS transistor 140 having the control terminal connected to the second node B. Because the first inverted read enable signal EN1B has the logic low value and the read enable signal EN1 has the logic high value, the PMOS transistor 144 receiving the inverted first read enable signal EN1B and the NMOS transistor 142 receiving the first read enable signal EN1 are turned on. As a result, because the voltage at the node C has a voltage level corresponding to the precharge current Ipcg, the read data RD_DATA has a voltage level, e.g., a logic high value, which is determined according to the ground voltage VSS and the magnitude of the precharge current Ipcg.

Referring to FIG. 3A and FIG. 5A, the first read circuit 120a may generate the slow quenching pattern of the read voltage at the first node A in response to the read control signal RD. For example, the first read controller 121a may generate the read supply voltage V_BL, which has a substantially constant positive voltage level during an initial period T1a of a read operation mode and gradually decreases from the constant positive voltage level during subsequent periods T2a, T3a, and T4a of the read operation mode. The second read controller 123a may generate the driver control signal Vg having a substantially constant voltage level during the periods T1a, T2a, T3a, and T4a in response to the read control signal RD. The driver 125a may drive the read voltage at the first node A in response to the read supply voltage V_BL and the driver control signal Vg. Therefore, during the initial period T1a, the read voltage at the first node A may have a level that is substantially equal to the positive voltage level of the read supply voltage V_BL, and during the subsequent periods T2a, T3a, and T4a, the read voltage at the first node A may gradually decrease from the positive voltage level.

During the initial period T1a, the read voltage at the first node A may have the level that is substantially equal to the positive voltage level of the read supply voltage V_BL output from the first read circuit 120a, and the second node B may have a level corresponding to the negative voltage VN by the second read circuit 130a.

During the initial period T1a, when the variable resistance element included in the selected memory cell is in the low resistance state, the selecting element included in the selected memory cell may be turned on. This is because, when the variable resistance element is in the low resistance state, the positive read voltage and the negative voltage VN applied to both ends of the selected memory cell may be determined such that a voltage applied across the selecting element is sufficiently high to turn on the selecting element. When the selecting element is turned on, the resistance value of the selected memory cell may rapidly decrease. Thus, an overshoot may occur in the cell current Icell flowing through the selected memory cell. When such an overshoot occurs, the variable resistance element may switch from the low resistance state to the high resistance state. A pattern of the cell current Icell when the overshoot occurs may correspond to a fast quenching pattern of the cell current Icell. For example, the pattern of the cell current Icell corresponding to the fast quenching pattern may have a peak value exceeding a predetermined value and a slope sufficiently high to result in an amorphous structure of the variable resistance element. Such a phenomenon, e.g., switching of the resistance state of the variable resistance element due to the fast quenching pattern of the cell current Icell, may be referred to as read disturbance.

Thus, when the first read circuit 120a generates the slow quenching pattern of the read voltage at the first node A during the subsequent periods T2a to T4a, the slow quenching pattern of the cell current Icell shown in FIG. 5A may be generated. Then, the variable resistance element in the selected memory cell that has switched from the low resistance state to the high resistance state due to the read disturbance may return to the low resistance state based on the cell current Icell having the slow quenching pattern.

Referring back to FIG. 4, the second read circuit 130a may generate the read data RD_DATA based on the cell current Icell having the slow quenching pattern during the initial period T1a or one of the subsequent periods T2a, T3a, and T4a.

For example, when the magnitude of the cell current Icell is larger than the magnitude of the reference current Iref, i.e., the selected memory cell is in the low resistance state, the voltage at the second node B may have a level substantially equal to the read voltage at the first node A. Thus, the second read circuit 130a may generate the read data RD_DATA having a level corresponding to the negative voltage VN, i.e., the logic low value.

Although not illustrated in the drawings, when the variable resistance element included in the selected memory cell is in the high resistance state, the selecting element included in the selected memory cell may be turned off. This is because, when the variable resistance element is in the high resistance state, a voltage across the selecting element is not sufficiently high to turn on the selecting element. When the selecting element is turned off, the overshoot may not occur in the cell current Icell. At this time, the cell current Icell may have a substantially constant magnitude, regardless of whether the read voltage has the slow quenching pattern or the fast quenching pattern. The constant magnitude of the cell current Icell may be smaller than that of the reference current Iref.

FIGS. 5B and 5C include similar operations to FIG. 5A, except for the process of generating the slow quenching pattern of the read voltage. Therefore, the detailed descriptions thereof are omitted herein for the interest of brevity.

The above-described implementations can suppress read disturbance, thereby improving the reliability of the read operation of the memory device.

The above and other memory circuits or semiconductor devices based on the disclosed technology may be used in a range of devices or systems. FIGS. 6-10 provide some examples of devices or systems that may implement the memory circuits disclosed herein.

Figure 6:
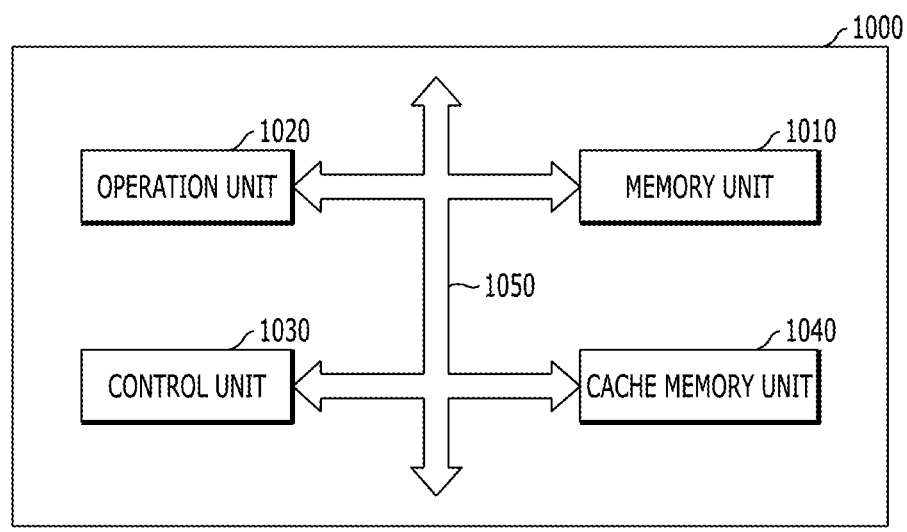
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
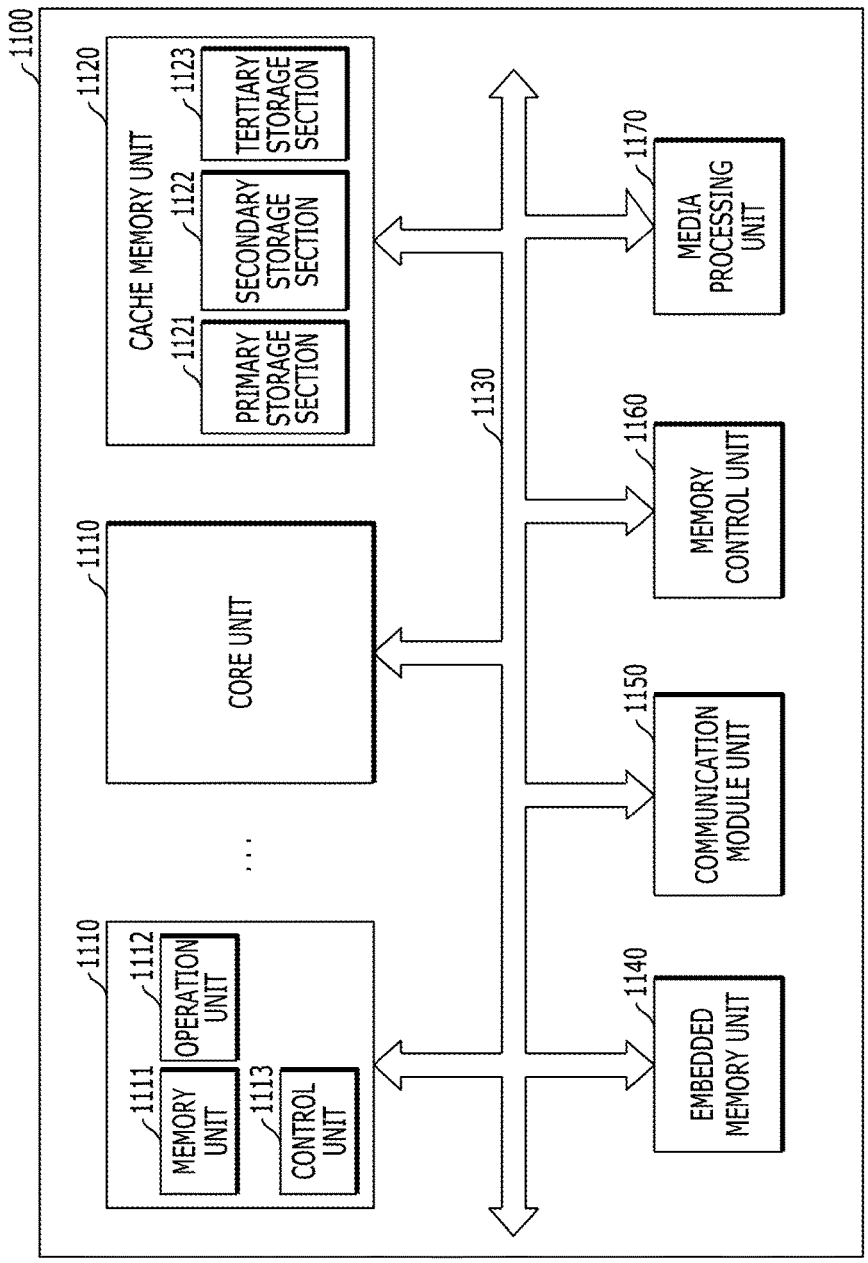
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the cache memory unit 1120 may be improved. As a consequence, performance characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
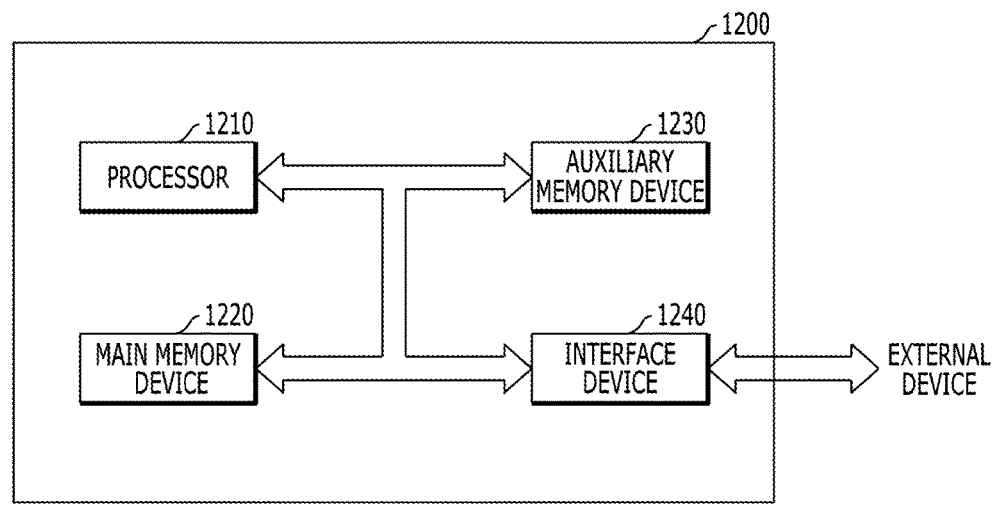
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off.

The main memory device 1220 may include one or more of the above-described semiconductor devices in accordance with the implementations. For example, the main memory device 1220 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
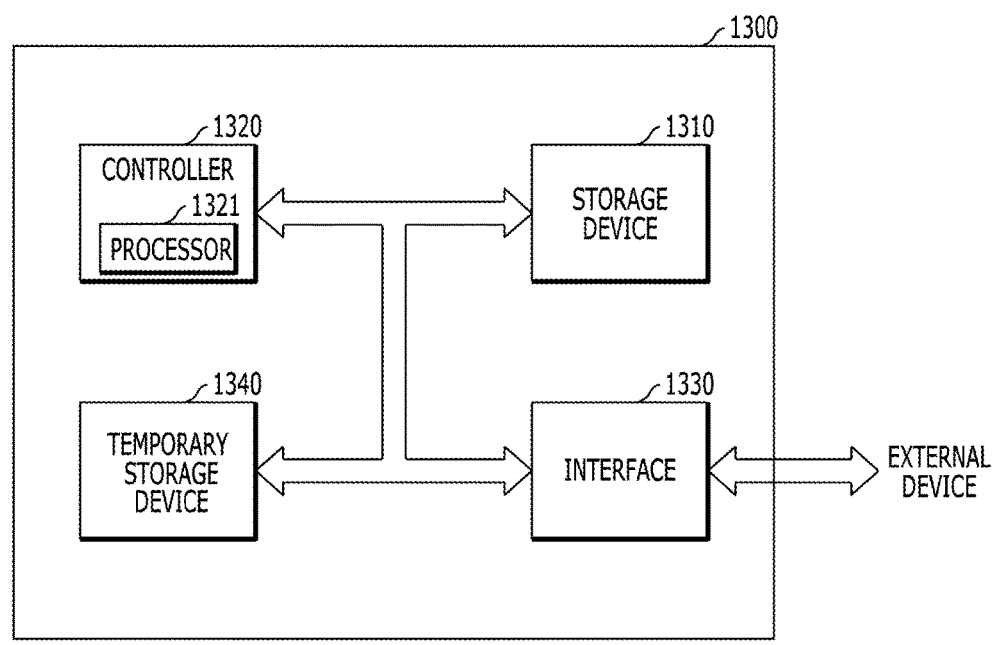
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the temporary storage device 1340 may be improved. As a consequence, performance characteristics of the system 1300 may be improved.

Figure 10:
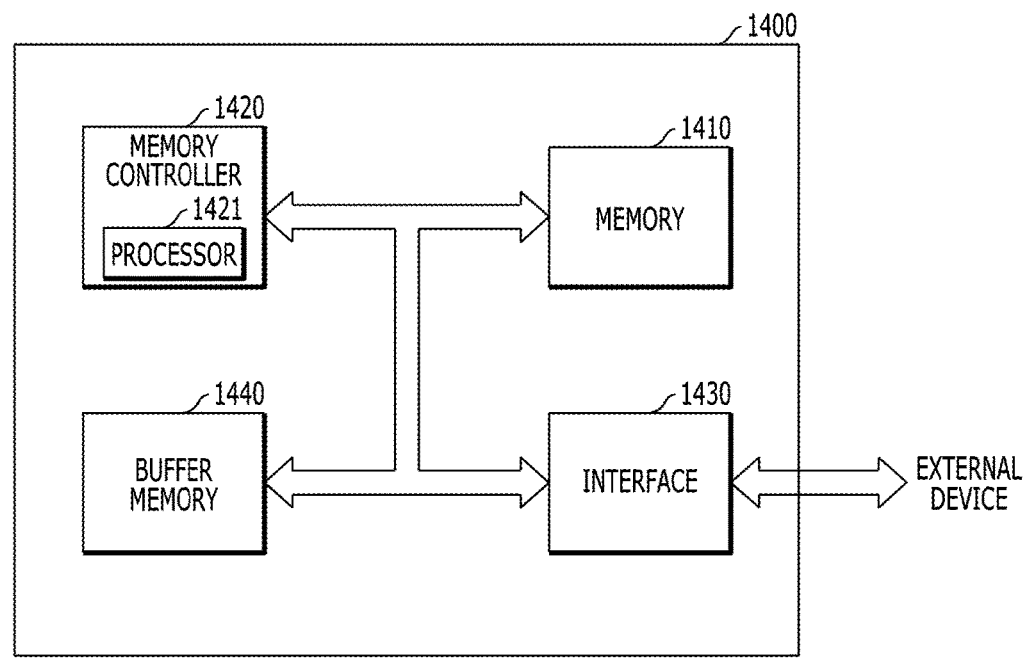
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the memory 1410 may be improved. As a consequence, performance characteristics of the microprocessor 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a memory cell coupled between first and second lines, the memory cell having a specific resistance state; a first read circuit suitable for supplying a slow quenching pattern of a read voltage to the first line to generate a cell current, the cell current corresponding to the specific resistance state of the memory cell during a read operation mode; and a second read circuit suitable for generating read data based on the cell current flowing through the second line during the read operation mode. Through this, characteristics of the buffer memory 1440 may be improved. As a consequence, performance characteristics of the microprocessor 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, wherein the semiconductor memory comprises:
    a memory cell coupled between first and second lines, the memory cell having a specific resistance state;
    a first read circuit suitable for supplying a slow quenching pattern of a read voltage to the first line to generate a cell current, the cell current corresponding to the specific resistance state of the memory cell during a read operation mode; and
    a second read circuit suitable for generating read data based on the cell current flowing through the second line during the read operation mode.

2. The electronic device of claim 1, wherein the specific resistance state comprises a low resistance state.

3. The electronic device of claim 1, wherein the slow quenching pattern has a slope sufficiently low to maintain the specific resistance state of the memory cell during the read operation mode.

4. The electronic device of claim 1, wherein the first read circuit comprises:
    a first read controller suitable for generating the slow quenching pattern of a read supply voltage during the read operation mode;
    a second read controller suitable for generating a driver control signal, the driver control signal having a substantially constant voltage level during the read operation mode; and
    a driver suitable for driving a node coupled to the first line to a voltage level substantially equal to the read supply voltage in response to the driver control signal.

5. The electronic device of claim 1, wherein the first read circuit comprises:
    a first read controller suitable for generating a read supply voltage having a substantially constant voltage level during the read operation mode;
    a second read controller suitable for generating a slow quenching pattern of a driver control signal during the read operation mode; and
    a driver suitable for driving a node coupled to the first line in response to the read supply voltage and the driver control signal.

6. The electronic device of claim 1, wherein the first read circuit comprises:
    a first read controller suitable for generating a read supply voltage having a substantially constant voltage level during the read operation mode;
    a second read controller suitable for generating a plurality of driver control signals, which are sequentially deactivated, during the read operation mode; and
    a plurality of drivers suitable for driving a node coupled to the first line in response to the plurality of read control signals, respectively, and the read supply voltage.

7. The electronic device of claim 1, wherein the memory cell comprises a variable resistance element and a selecting element which are coupled in series,
wherein the variable resistance element switches between resistance states according to a voltage or a current applied two ends of the variable resistance element, the cell current flowing through the variable resistance element according to the specific resistance state, and
wherein the selecting element is turned on or off according to a voltage difference across the memory cell and a resistance value of the variable resistance element.

8. The electronic device of claim 1, wherein the first read circuit supplies a predetermined first voltage to the first line during at least an initial period of the read operation mode, and
wherein the second read circuit supplies a predetermined second voltage to the second line during the read operation mode, the first voltage being higher than the second voltage.

9. The electronic device of claim 1, wherein the second read circuit generates the read data by comparing a magnitude of a reference current and a magnitude of the cell current.

10. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

11. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

12. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

13. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

14. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

15. A method of driving an electronic device including a semiconductor memory, the method comprising:
supplying a predetermined voltage level of a read voltage to a first line coupled to a first end of a selected memory cell during an initial period of a read operation mode;
supplying a slow quenching pattern of the read voltage to the first line during a subsequent period of the read operation mode, the subsequent period following the initial period; and
generating read data based on a cell current flowing through a second line coupled to a second end of the selected memory cell during the subsequent period of the read operation mode.

16. The method of claim 15, wherein the slow quenching pattern has a slope sufficiently low to maintain a resistance state of the selected memory cell during the read operation mode.

17. The method of claim 15, wherein the supplying of the predetermined pattern of the read voltage comprises:
supplying the slow quenching pattern of a read supply voltage;
generating a driver control signal having a substantially constant voltage level; and
driving a node coupled to the first line to have a voltage level substantially equal to the read supply voltage in response to the driver control signal.

18. The method of claim 15, wherein the supplying of the predetermined pattern of the read voltage comprises:
generating a read supply voltage having a substantially constant voltage level;

generating the slow quenching pattern of a driver control signal; and driving a node coupled to the first line in response to the read supply voltage and the driver control signal.

19. The method of claim 15, wherein the supplying of the predetermined pattern of read voltage comprises:

generating a read supply voltage having a substantially constant voltage level;

generating a plurality of driver control signals which are sequentially deactivated; and driving a node coupled to the first line in response to the read supply voltage and the plurality of driver control signals.

20. The method of claim 15, wherein the generating of the read data comprises:

comparing a magnitude of the cell current and a magnitude of a reference current; and generating the read data based on the comparison result.

* * * * *